United States Patent
Milanesi

(10) Patent No.: US 6,437,607 B1
(45) Date of Patent: Aug. 20, 2002

(54) NON LINEAR CIRCUIT FOR OPEN LOAD CONTROL IN LOW-SIDE DRIVER TYPE CIRCUITS

(75) Inventor: Andrea Milanesi, Castelnoceto (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/697,234

(22) Filed: Oct. 26, 2000

(30) Foreign Application Priority Data

Oct. 28, 1999 (IT) ........................................ MI99A02249

(51) Int. Cl.[7] ................................................. H03K 5/22
(52) U.S. Cl. ........................... 327/90; 327/64; 327/427; 327/581; 307/413; 361/88; 361/93.1
(58) Field of Search ..................... 327/108–111, 50–52, 327/56, 57, 63, 58, 72, 64, 76, 90, 82, 538, 541, 419, 581, 20, 427, 440, 434; 307/412, 413; 361/88, 90, 93.1

(56) References Cited

U.S. PATENT DOCUMENTS 5,438,286 A * 8/1995 Pavlin et al. ................. 327/50
5,760,613 A * 6/1998 Pulvirenti et al. ............ 327/67
6,215,338 B1 * 4/2001 Gervasi et al. .............. 327/108

* cited by examiner

Primary Examiner—Timothy P. Callahan
Assistant Examiner—Minh Nguyen
(74) Attorney, Agent, or Firm—Wolf, Greenfield & Sacks, P.C.; James H. Morris

(57) ABSTRACT

Non linear circuit for open load control in Low-Side Driver type circuits, including at least two power transistors, scaled according to an area ratio 1 to M, with M>1, wherein the power transistor having the smaller area is controlled by a circuit input signal while the transistor having the larger area is controlled by an output value of an AND type logic gate, managed by a control circuit, that is regulated by the output value of a voltage sensor, placed in parallel with the power transistor having the larger area, and by the output value of a current sensor, placed in series with the power transistor having the smaller area, so that, when a current flowing in the power transistor having the smaller area is less than a predetermined value of the threshold current, the control circuit signals the open load on an output pin.

15 Claims, 2 Drawing Sheets

NON LINEAR CIRCUIT FOR OPEN LOAD CONTROL IN LOW-SIDE DRIVER TYPE CIRCUITS

BACKGROUND OF THE INVENTION

1. Field of the Invention

The present invention relates to a non linear circuit for open load control in Low-Side Driver type circuits.

2. Discussion of the Related Art

Modem integrated circuits, having switches placed on the ground side, called Low-Side Drivers, usually contain some checking circuits adapted for signaling malfunctions caused by load separation, a situation known as open load in the technical literature.

These checking circuits point out not only the load existence, and therefore also the absence, when the power transistor placed at the output is turned off but also when the transistor is turned on.

In the case that the power transistor is turned off, the load absence condition, that is the open load condition, is verified by the output voltage measurement, while in the case that the power transistor is turned on the current flowing in the power transistor must be measured and checked to see if this current is less than a predetermined value of the threshold current, a value describing the open load.

The problem consists, therefore, in the measurement of this threshold current, that flows in the power transistor, and also in the correct signaling of the open load.

In view of the state of the art described, it is an object of the present invention to measure the threshold current with precision so as to avoid uncertainty situations about the load condition, this resulting from measuring the threshold current with circuit elements not depending on the power transistor.

SUMMARY OF THE INVENTION

According to the present invention, this and other objects are achieved by a non linear circuit for open load control in Low-Side Driver type circuits, comprising at least two power transistors, scaled according to an area ratio 1 to M, with M>1, wherein the power transistor having the smaller area is controlled by a circuit input signal while the transistor having the larger area is controlled by the output value of an AND type logic gate managed by a control circuit, that is regulated by the output value of a voltage sensor placed in parallel with the power transistor having the larger area, and by the output value of a current sensor placed in series with the power transistor having the smaller area, so that, when a current flowing in the power transistor having the smaller area is less than a predetermined value of the threshold current, the control circuit signals the open load on an output pin.

As a result of the present invention it is possible to make a circuit for open load checking in a Low-Side Driver type circuit when this circuit is turned on, having the maximum precision in evaluating the load leakage limit current and eliminating circuit instability drawbacks because there are no reaction loops including linear circuits to be compensated.

BRIEF DESCRIPTION OF THE DRAWINGS

The features and the advantages of the present invention will be made evident by the following detailed description of an embodiment thereof which is illustrated as not limiting example in the annexed drawings, wherein.

DETAILED DESCRIPTION

Figure 1:
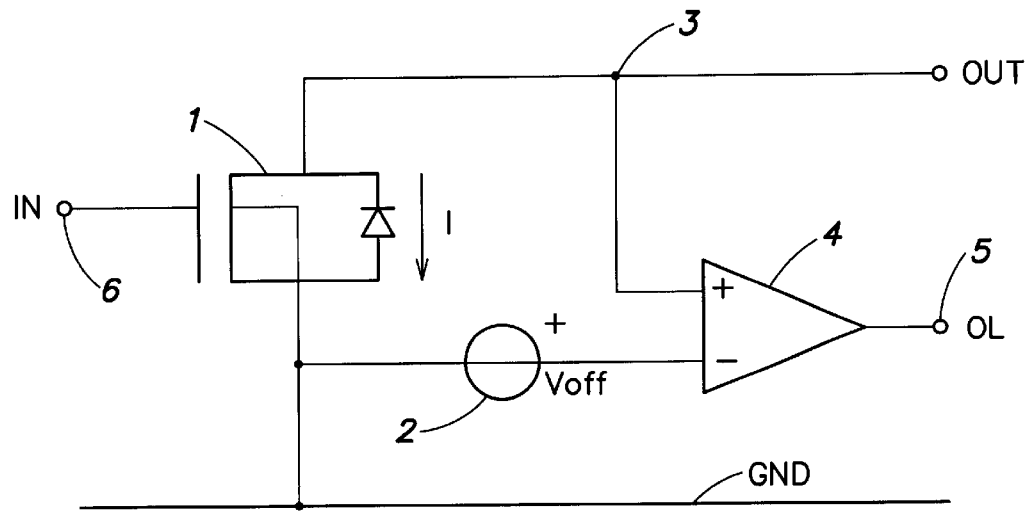
FIG. 1 shows a Low-Side Driver type circuit according to the prior art.

In FIG. 1 a circuit Low-Side Driver type according to the prior art is shown.

As shown in such Figure a power transistor 1, for example a DMOS type (Double Diffused Metal Oxide Semiconductor), has the source terminal connected to ground, called GND, and also in common with a voltage source 2, called Voff; the gate terminal 6 is the circuit input, called IN, and the drain terminal 3 is the output, called OUT. The drain terminal 3, also, is in common with the non inverting input of a comparator 4.

The source Voff 2 is on the non inverting input of said comparator 4, the output of which provides the signal of a load presence or absence.

The circuit shown in FIG. 1 measures the current I that flows through the DMOS 1, by means of the measurement of the voltage drop Vds on its terminals, and compares the voltage Vds with voltage Voff of the source 2, that acts, therefore, as a reference voltage.

The comparator 4 evaluates the open load 5 when the current I flowing in the DMOS 1 is less than a subthreshold current, called Isoglia, deduced from the ratio of the voltage Voff to the DMOS 1 start up resistance, called Ron1, that is: I<Isoglia with Isoglia=Voff/Ron1.

The threshold current value is not very precise because the resistance Ron1 of the DMOS 1 is sensitive to the temperature variations, especially Ron1 increases with temperature, and to the process parameters and this, therefore, causes low precision in the pen load signaling.

Figure 2:
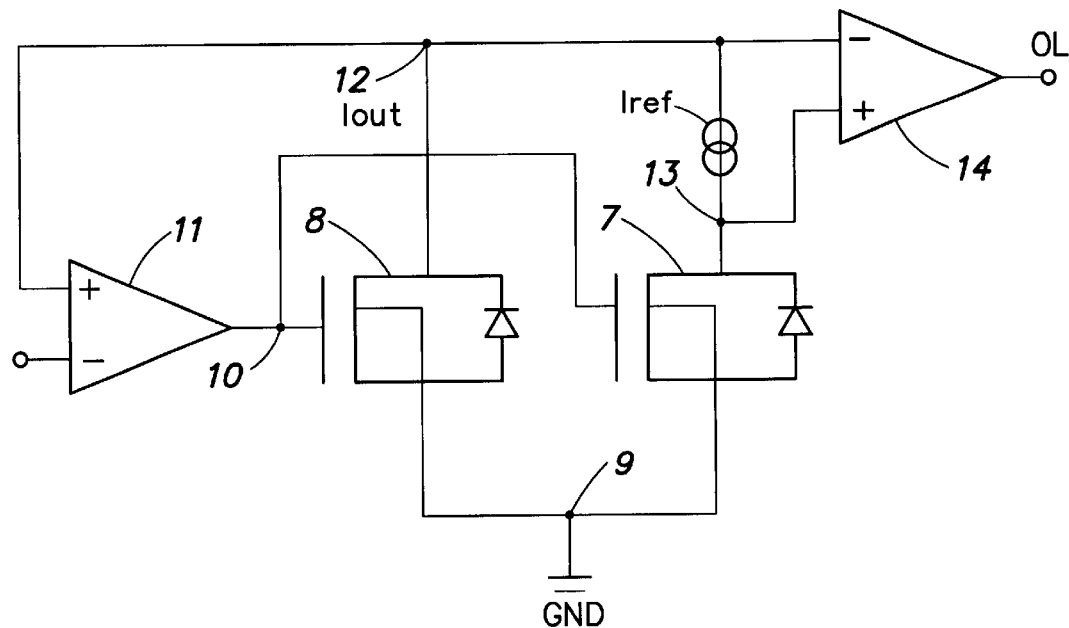
FIG. 2 shows another Low-Side Driver type circuit according to the prior art.

In FIG. 2 a Low-Side Driver type circuit according to the prior art is shown.

As shown in such Figure, the power transistor is divided into two transistors 7 and 8, wherein the first one of the two transistors acts as current detector. The two transistors have in common the gate terminals 10 and the source terminals 9, that are to ground. The two transistor gates are on the output of an operational amplifier 11 at the inverting input of which there is an output limit voltage while the non inverting input is connected with the drain 12 of the transistor 8. Moreover the drain terminal 13 of the transistor 7 is connected with the non inverting input of a comparator 14, adapted for signaling the open load. The comparator 14 has the inverting input connected with the drain 12, while the drain 13 is connected with a constant value current source Iref.

The circuit is able to compare the output current Iout with the current Iref generated internally to establish if the circuit is in an open load situation or not, giving rise to a signal on the output of the comparator 14, output called OL.

However the effective implementation of such a circuit is difficult because of compensation needed due to the high gain of the power transistor caused by the common source configuration, that is the source terminal is connected to ground, and to the operation in weak reversion.

This scheme is equal to that used in High Side circuits and described in the article "A 70 mOhm Intelligent High Side Switch with fall Diagnostics", IEEE J. Soild State Circ.vol. 31, pp. 915–923, July 1996.

In the case of High Side circuits, there are minor problems of stability of the reaction loop, because the power transistors are used as voltage followers (unity gain).

Figure 3:
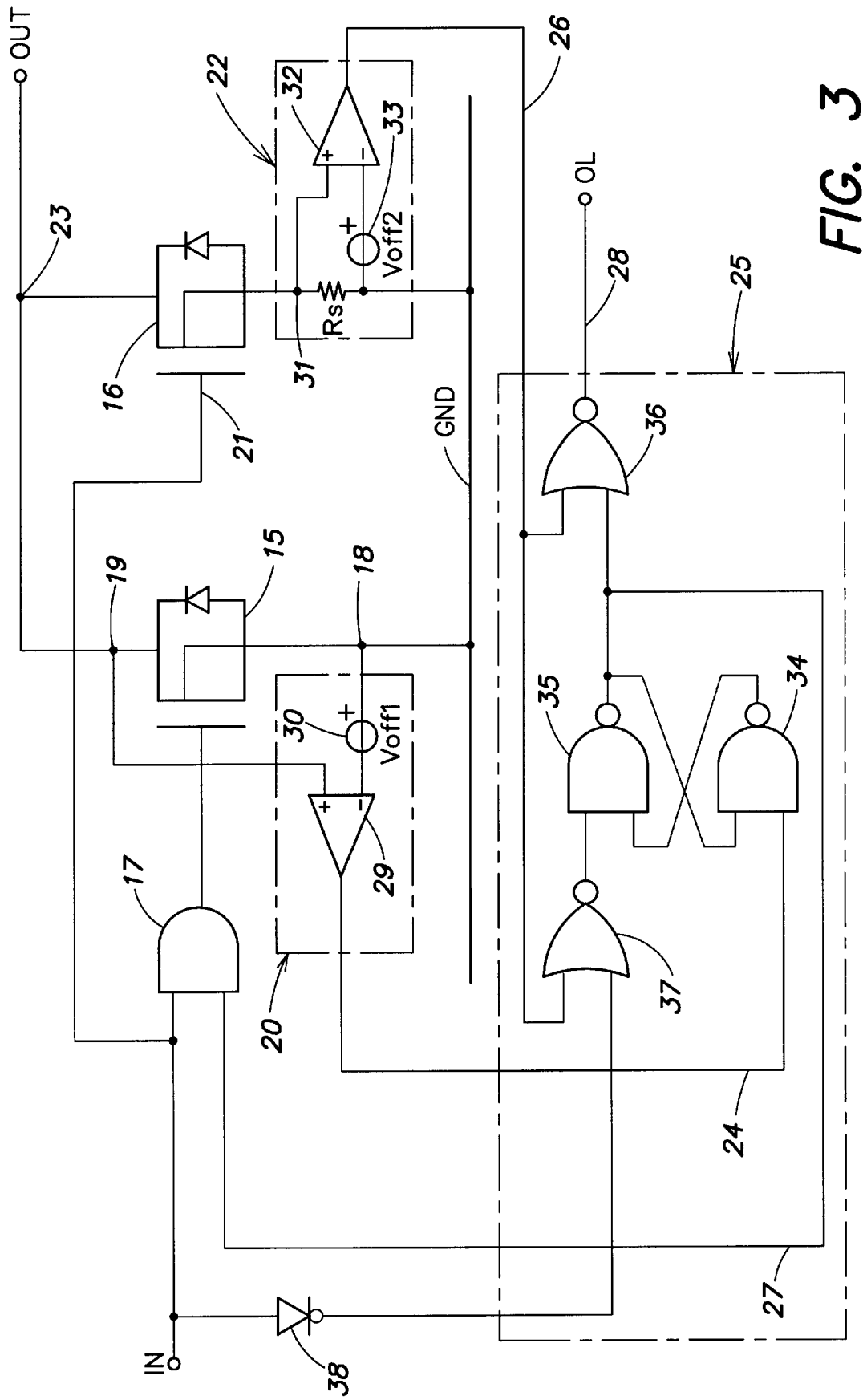
FIG. 3 shows a simplified schematic diagram of a Low-Side Driver type circuit according to the invention.

In FIG. 3 a Low-Side Driver circuit scheme according to the invention is shown.

As shown in FIG. 3, the power transistor is divided into two parts 15 and 16, scaled according to an area ratio 1 to M, with M >1, where the transistor 15 of area M has the gate terminal connected with the AND logic gate output 17, the source terminal 18 connected with the ground and the drain terminal 19 is the input of a block 20, that acts as voltage sensor. The transistor 16 has the gate terminal 21 connected with a circuit logic input, called IN, has the source terminal that is the input of a block 22 that acts as a current sensor, in turn connected with the ground and the drain terminal 23 of the transistor 16 on the circuit output, called OUT.

The block 20 generates a signal 24 that acts as input of a block 25, called a control circuit, and that the block 22 generates a signal 26 that also acts as input for the block 25. Moreover the block 25 has as input the input signal IN also.

The block 25 generates two output signals 27 and 28, where the signal 27 is the other input of said logic gate 17 while the signal 28, called OL, signals the absence/presence load condition.

When the input IN is shifted to a high logic level, both transistors 15 and 16 are saturated, that is they are turned on. If the output voltage on the output line OUT decreases below a predetermined level, determined during the projecting time, level sensed by the block 20, this means that the current flowing in the transistor 15 is not high and the block 25 turns off the transistor 15. At this point the output current is conducted totally by the transistor 16, and the block 22 measures said current. According to the measurement of the current, if it results that this current is less than a predetermined threshold the block 25 signals the open load through the output pin OL, while if the measurement shows a current grater than the prefixed threshold the block 25 turns on again the transistor 15.

In the same FIG. 3 the blocks 20, 22 and 25 are shown in detail.

We note that the drain terminal 19 is the non inverting input of a comparator 29, while the source terminal 18 is connected with a constant value source voltage 30, called Voff1, that is the inverting input of the comparator 29. The block 20, therefore, acts as voltage sensor. The comparator 29 and the voltage source 30 form all together the voltage sensor 20.

The source terminal 31 of the transistor 16 has in series a resistance Rs and the non inverting input of the comparator 32, while the inverting terminal is connected to a voltage source 33 of constant value Voff2 connected to ground. The block 22, therefore, acts as current sensor. The comparator 32, the source 33 and the resistance Rs form all together the current sensor 22.

The lines 24 and 26 are the inputs of a flip-flop type structure, formed by the NAND logic gates 34 and 35 and the NOR logic gate 36 and 37, that form all together the control circuit 25. In particular, the line 24 is the input of the NAND logic gate 34, that acts as reset signal, called R, of the pair of logic gates 34 and 35, the output signal of which, in combination with the signal IN complemented by means of the NOT gate 38 with said input 26, acts as set signal, called S, of the pair of logic gates 34 and 35.

The line 27 represents the stored state Q, that is the output, of the pair of NAND gates 34 and 35.

If there is a low logic level signal on the input IN the gate 38 inverts said signal IN, that is it makes it of a high logic level, and therefore the gate output 37 is low so that the stored state signal Q is shifted to high. In these conditions both the transistors 15 and 16 are turned off.

A high state signal Q inhibits working of the gate 36, the output of which will be locked to a low level, and enables the gate 17, that will be able to transmit a possible signal on the input IN.

If the input IN passes to a high logic value, both the power transistors 15 and 16 are turned on. If the voltage drop on the power transistors is greater than the source value 30, there is no malfunction, while if the voltage drop is less than the voltage value, the comparator 29, by means of the line 24, sets a new value on the pair of gates 34 and 35 and the stored state output is set low, that means turning off the transistor 15. Now the whole current is conducted by the transistor 16 and this current is compared with a current, called threshold current Isoglia, having a value equal to the ratio between the voltage source 33 and the resistance Rs, that is: Isoglia= Voff2/Rs; if the flowing current in said transistor 16 is greater than the current Isoglia, the flip-flop structure is set by the output value of the comparator 32 so that the power transistor 15 is turned on again, while if the flowing current in the transistor 16 is less than the threshold value current Isoglia the open load is signaled, setting the output pin OL to a high logic level.

In order that the circuit operation, heretofore described, can be executed, it is necessary that the start up resistance of both the power transistors and the resistance Rs are scaled so that the load absence can be always signaled and this is realized by the way that the threshold current Isoglia multiplied by the parallel between the start up resistance of the transistor 15, called Ron15, and the resistance formed by the series of the resistance Rs with the start up resistance of the transistor 16, called Ron16, is less than the value of the voltage source 30, that is: Isoglia *[Ron15//(Ron16+Rs)] <Voff1.

This expression means that the voltage drop caused by the threshold current Isoglia flowing in the transistors 15 and 16 when both are in saturation region, that is when both are turned on, must always be less than the value of the voltage source 30, so that it is possible to signal correctly the load absence.

Moreover, the maximum current capable of being conducted by the transistor 16 because the voltage between the terminals of the transistor must never exceed the maximum saturation voltage, called Vsat, described in the features of the transistor16, that is: [Voff1 / (Ron15//Ron16)]* (Ron15+ Rs)<Vsat.

Making the measurement with a circuit according to the invention has, therefore, good precision because the source values 30 and 33 and the resistance value Rs are not connected in any way with the power transistors 15 and 16 that have a start up resistance Ron15 and Ron16 that vary as a function of the operating temperature and as a function of the drain current that flows in the transistors.

Moreover, it is intrinsically a stable solution because there are no reaction loops including linear circuits and therefore compensation for such reaction loops is not required.

What is claimed is:

1. Circuit for open load control in Low-Side Driver type circuits, comprising at least two power transistors, scaled according to an area ratio 1 to M, with M>1, wherein the power transistor having a smaller area is controlled by a circuit input signal while the transistor having a larger area is controlled by an output of an AND type logic gate, managed by a control circuit, that is regulated by an output value of a voltage sensor, placed in parallel with the power transistor having the larger area, and by an output value of a current sensor, placed in series with the power transistor having the smaller area, so that, when a current flowing in the power transistor having the smaller area is less than a predetermnined value of a threshold current, the control circuit signals the open load on an output pin.

2. Circuit for open load control according to claim 1, wherein the power transistor having the larger area has a gate terminal connected to the output of the AND type logic gate, a source terminal connected with a constant value voltage generator and with ground and has a drain terminal connected with the output pin and with a non inverting input of a comparator, the comparator and the constant value voltage source forming the voltage sensor.

3. Circuit for open load control according to claim 1, wherein the power transistor having the smaller area has a gate terminal connected to the circuit input, a drain terminal connected with the output pin and a source terminal in series with a resistance and with ground and moreover the source terminal is connected with a non inverting terminal of a comparator and with a constant value voltage source, the comparator and the constant value voltage source forming the current sensor.

4. Circuit for open load control according to claim 1, wherein the threshold current multiplied by a parallel combination between a start up resistance of the power transistor having the larger area and a resistance given by a sum of a series resistance of the power transistor having the smaller area and a start up resistance of the power transistor having the smaller area is less than a voltage value of the voltage source on the voltage sensor.

5. circuit for open load control according to claim 1, wherein the power transistors and a resistance in series with the power transistor having the smaller area are scaled so that a voltage between a source terminal and a drain terminal of said power transistor having the smaller area does not exceed a maximum saturation voltage of the power transistor having the smaller area.

6. circuit according to claim 5, wherein the voltage between the source terminal and the drain terminal of the power transistor having the smaller area is given by a sum of a resistance placed in series with the power transistor having the smaller area, comprised in the current sensor, and a start up resistance of the power transistor having the smaller area, multiplied by the current given by the ratio between a value of a source in the voltage sensor and the parallel combination of the start up resistances of said two power transistors.

7. circuit for open load control according to claim 1, wherein the power transistor having the larger area is an n channel DMOS type transistor.

8. circuit for open load control according to claim 1, wherein the power transistor having the smaller area is an n channel DMOS type transistor.

9. circuit for open load control according to claim 1, wherein the control circuit, comprising a plurality of NAND type logic gates and NOR type logic gates, receives in input a first signal generated by the voltage sensor, a second signal generated by the current sensor and a third signal inverted by a NOT type logic gate, to provide a flip-flop type storage structure for said input signals.

10. circuit for open load control according to claim 9, wherein the control circuit outputs a first output signal that is the input of the AND type logic gate and generates a second output signal, adapted for signaling the load absence/presence on the output pin.

11. A non-linear circuit for open load control, comprising:

first and second power transistors scaled according to an area ratio of 1 to M, wherein M>1 and an area of the first transistor is larger than an area of the second transistor;

a voltage sensor connected in parallel with the first transistor that compares a voltage drop across the first transistor with a reference voltage and provides a first signal when the voltage drop is less than the reference voltage;

a control circuit that receives the first signal and generates a second signal in response to the first signal to turn the first transistor off; and a current sensor connected in series with the second transistor that monitors a current flowing in the second transistor when the first transistor is turned off and provides a third signal to the control circuit when the current is less than a predetermined threshold;
wherein the control circuit signals an open load condition upon receipt of the third signal.

12. The circuit of claim 11, further comprising means for turning off the first transistor, the means being coupled to a gate of the first transistor and to the control circuit, the means being adapted to turn off the first transistor in response to receiving the second signal from the control circuit.

13. The circuit of claim 12, wherein the means for turning off the first transistor includes an AND-type logic gate.

14. The circuit of claim 11, wherein the voltage sensor comprises a first comparator.

15. The circuit of claim 14, wherein the current sensor comprises a second comparator.

* * * * *